(12) United States Patent
Wei et al.

(10) Patent No.: US 11,973,140 B2
(45) Date of Patent: Apr. 30, 2024

(54) DRIVING SYSTEM, DRIVING METHOD, COMPUTER SYSTEM AND NON-TRANSITORY COMPUTER READABLE MEDIUM

(71) Applicants: Haining ESWIN IC Design Co., Ltd., Jiaxing (CN); Beijing ESWIN Computing Technology Co., Ltd., Beijing (CN)

(72) Inventors: Chiajen Wei, Jiaxing (CN); Leung Yu, Jiaxing (CN); Shuqi Wei, Jiaxing (CN)

(73) Assignees: HAINING ESWIN IC DESIGN CO., LTD., Jiaxing (CN); BEIJING ESWIN COMPUTING TECHNOLOGY CO., LTD., Beijing (CN)

( * ) Notice: Subject to any disclaimer, the term of this patent is extended or adjusted under 35 U.S.C. 154(b) by 207 days.

(21) Appl. No.: 17/569,014

(22) Filed: Jan. 5, 2022

(65) Prior Publication Data
US 2023/0009604 A1    Jan. 12, 2023

(30) Foreign Application Priority Data
Jul. 8, 2021    (CN) .......................... 202110772644.2

(51) Int. Cl.
*H02M 1/00*    (2006.01)
*H01L 29/78*    (2006.01)
(Continued)

(52) U.S. Cl.
CPC ........ *H01L 29/7826* (2013.01); *H01L 29/786* (2013.01); *H02M 1/08* (2013.01); *H03K 17/08122* (2013.01)

(58) Field of Classification Search
CPC .......................... H02M 1/08; H03K 17/08122
See application file for complete search history.

(56) References Cited

U.S. PATENT DOCUMENTS

2003/0214345 A1* 11/2003 Yamauchi ................ G11C 5/14
327/530
2006/0197697 A1* 9/2006 Nagata ................ G01R 31/2884
342/22

(Continued)

FOREIGN PATENT DOCUMENTS

JP    2014086491 A    5/2014
JP    2017127108 A    7/2017

*Primary Examiner* — Sisay G Tiku
(74) *Attorney, Agent, or Firm* — Scully, Scott, Murphy & Presser, P.C.

(57) ABSTRACT

It is provided a driving system, a driving method, a computer system and a computer readable medium. The driving system includes: an input circuit configured to receive an input on-chip voltage and output the on-chip voltage; an adjusting circuit configured to automatically detect a present amplitude of the on-chip voltage output by the input circuit and to output a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage. The protection of the transistor gate and the adjusting of a receiver threshold voltage for different I/O (input/output) voltages and levels can be completed through automatic detection of the on-chip voltage and automatic adjusting.

16 Claims, 6 Drawing Sheets

(51) Int. Cl.
*H01L 29/786* (2006.01)
*H02M 1/08* (2006.01)
*H03K 17/0812* (2006.01)

(56) References Cited

U.S. PATENT DOCUMENTS

| | | | | |
|---|---|---|---|---|
| 2006/0232307 | A1* | 10/2006 | Kanno | H01L 27/105 |
| | | | | 257/E27.081 |
| 2008/0096490 | A1* | 4/2008 | Okazaki | H04B 1/403 |
| | | | | 455/76 |
| 2009/0079407 | A1* | 3/2009 | Morishita | G05F 1/465 |
| | | | | 323/280 |
| 2010/0289561 | A1* | 11/2010 | Choi | G11C 7/22 |
| | | | | 327/538 |
| 2011/0267140 | A1* | 11/2011 | Kim | H03H 11/30 |
| | | | | 327/594 |
| 2013/0015837 | A1* | 1/2013 | Jenkins | G01R 31/31708 |
| | | | | 324/76.11 |
| 2013/0120020 | A1* | 5/2013 | Li | H03K 19/01855 |
| | | | | 326/30 |
| 2014/0029702 | A1* | 1/2014 | Wu | H04L 25/0292 |
| | | | | 375/340 |
| 2014/0111268 | A1 | 4/2014 | Imada | |
| 2017/0201183 | A1 | 7/2017 | Chen | |
| 2023/0060647 | A1* | 3/2023 | Banerjee | H03M 1/46 |
| 2023/0178979 | A1* | 6/2023 | Ciesluk | G06F 1/26 |
| | | | | 361/91.1 |

* cited by examiner

DRIVING SYSTEM, DRIVING METHOD, COMPUTER SYSTEM AND NON-TRANSITORY COMPUTER READABLE MEDIUM

TECHNICAL FIELD

The application relates to the field of integrated circuits, and more particularly, relates to a driving system, a driving method, a computer system and a computer readable medium for automatically detecting an on-chip voltage to adjust a gate voltage of a thin film transistor.

BACKGROUND

Thin-film transistors (TFTs) are a kind of important semiconductor devices, which have wide applicability in transparent, flexible electronic devices and portable electronic devices.

An on-chip voltage (OVDD) of a thin film transistor may be 3.3V, 2.5V and 1.8V. Therefore, an input/output driving circuit of the thin film transistor is also required to meet the reliability constraint of the thin film transistor interface with 3.3V/2.5V/1.8V so as to adapt to different gate voltages.

If different input/output driving circuits are designed according to different input/output voltages to avoid the gate stress problem of thin film transistors, it will not only increase the complexity of the designing, but also increase the area and power consumption, which greatly increases the cost.

Therefore, a driving circuit is necessary to adjust the gate voltage of the thin film transistor according to different on-chip voltages.

SUMMARY

According to an aspect of the present invention, it is provided a driving system for automatically detecting an on-chip voltage to adjust a gate voltage of a thin film transistor, including: an input circuit, configured to receive an input on-chip voltage and output the on-chip voltage; an adjusting circuit, configured to automatically detect a present amplitude of the on-chip voltage output by the input circuit and to output a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage.

According to another aspect of the present invention, it is provided a driving method for automatically detecting an on-chip voltage to adjust a gate voltage of a thin film transistor, including: an input step, receiving an input on-chip voltage by an input circuit and outputting the on-chip voltage; an adjusting step, automatically detecting a present amplitude of the on-chip voltage output by the input circuit by an adjusting circuit, and outputting a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage.

According to another aspect of the present invention, it is provided a computer system, including: a processor; a memory, coupled to the processor and storing therein computer-executable instructions for performing the driving method according to the embodiment of the present disclosure when executed by the processor.

According to another aspect of the present invention, it is provided a computer readable medium having a computer program stored thereon, wherein the program, when executed by a processor, implements the driving method according to an embodiment of the present disclosure.

In this way, the present amplitude of the on-chip voltage is detected, and the bias voltage is lower than the on-chip voltage with the present amplitude, thereby protecting the gate of the thin film transistor from bearing inappropriate voltage amplitude, and enabling the present driving system to adaptively use and protect the gate of the thin film transistor under any on-chip voltage of 3.3V, 2.5V, 1.8V or other amplitudes. Therefore, according to various embodiments of the present application, the protection of transistor gate and the adjusting of the receiver threshold voltage for different I/O (input/output) voltages and levels can be completed through automatic detection of the on-chip voltage and automatic adjustment.

BRIEF DESCRIPTION OF THE DRAWINGS

In order to explain more clearly the embodiments of this disclosure or the technical solutions in the prior art, the drawings required in the embodiments or the description of the prior art will be briefly introduced below. Obviously, the drawings in the following description are only some embodiments of this disclosure, and for those of ordinary skills in this field, other drawings can be obtained according to these drawings without paying creative labor.

DETAILED DESCRIPTION

Reference will now be made in detail to specific embodiments of the present invention, and examples of the present invention are illustrated in the accompanying drawings. Although the invention will be described with reference to specific embodiments, it should be understood that it is not intended to limit the invention to the described embodiments. Instead, it is intended to cover alterations, modifications and equivalents within the spirit and scope of the invention as defined by the appended claims. It should be noted that the methods and steps described herein may be implemented by any functional block or functional arrangement, and any functional block or functional arrangement may be implemented as a physical entity or a logical entity, or a combination of both.

Figure 1:
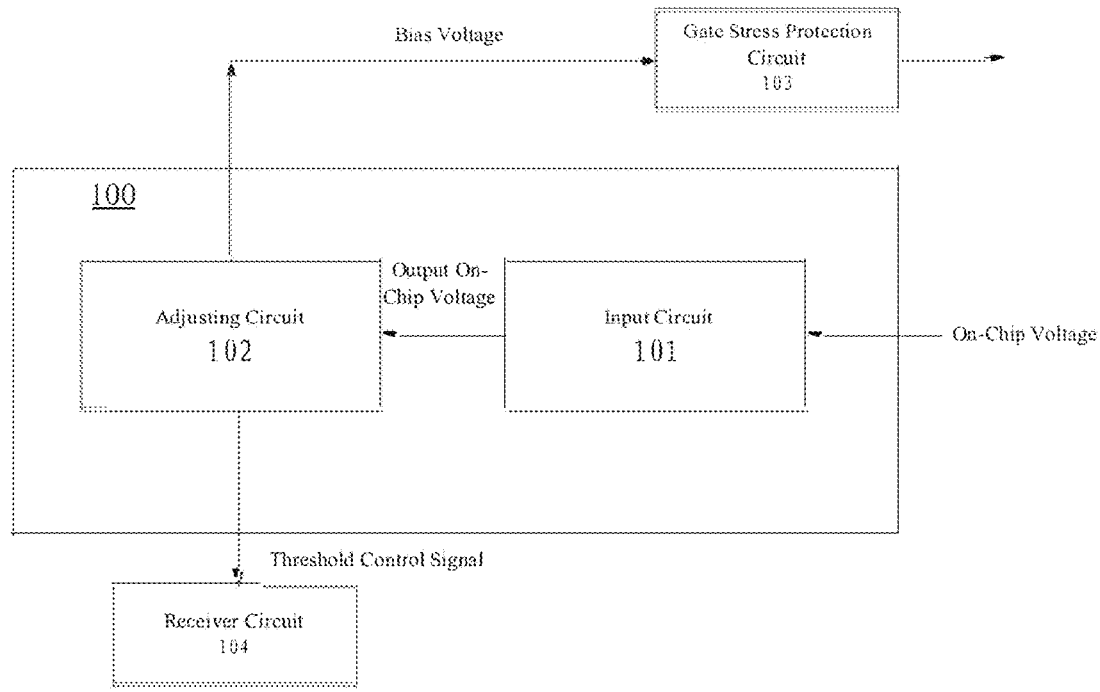
FIG. 1 illustrates a block diagram of a driving system for automatically detecting an on-chip voltage to adjust a gate voltage of a thin film transistor according to an embodiment of the present application.

FIG. 1 illustrates a block diagram of a driving system 100 for automatically detecting an on-chip voltage to adjust a gate voltage of a thin film transistor according to an embodiment of the present application.

The driving system 100 includes: an input circuit 101, configured to receive an input on-chip voltage and output the on-chip voltage; and an adjusting circuit 102, configured to automatically detect a present amplitude of the on-chip voltage output by the input circuit 101, and to output a bias voltage corresponding to the present amplitude of the on-chip voltage to a gate of the driven thin film transistor (in a gate stress protection circuit 103), wherein a source of the thin film transistor is directly or indirectly coupled to the on-chip voltage and the bias voltage is lower than the on-chip voltage.

In this way, the present amplitude of the on-chip voltage is detected, and the bias voltage is lower than the on-chip voltage with the present amplitude, thereby protecting the gate of the thin film transistor from bearing inappropriate voltage amplitude, and enabling the present driving system to adaptively use and protect the gate of the thin film transistor under any on-chip voltage of 3.3V, 2.5V, 1.8V or other amplitudes. Of course, the number of thin film transistors in the gate stress protection circuit 103 may more than one, wherein the source of the more than one thin film transistor is connected to the on-chip voltage. A circuit diagram of the gate stress protection circuit 103 will be described later.

The adjusting circuit 102 can also change the threshold value of the thin film transistor in a receiver circuit 104 according to the detected present amplitude of the on-chip voltage. Of course, the number of thin film transistors in the receiver circuit 104 may be more than one, wherein the source of more than one thin film transistor is connected to the on-chip voltage. A circuit diagram of the receiver circuit 104 will be described later.

Figure 2:
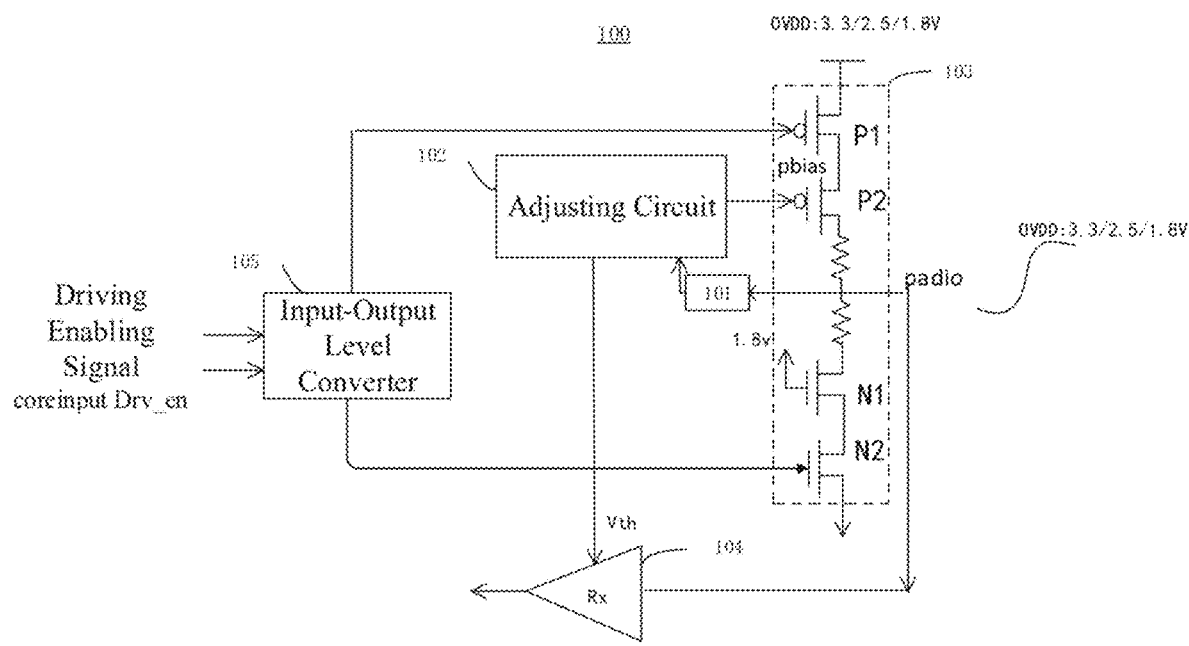
FIG. 2 illustrates a circuit diagram of a specific example circuit structure including a gate stress protection circuit, a driving system, a receiver circuit and an input-output level converter according to an embodiment of the present application.

FIG. 2 illustrates a circuit diagram of a specific example circuit structure including the gate stress protection circuit 103, a driving system 100, a receiver circuit 104 and an input-output level converter 105 according to an embodiment of the present application.

The adjusting circuit 102 in the driving system 100 receives the on-chip voltage input padio, i.e., OVDD, through the input circuit 101.

The gate stress protection circuit 103 includes two stacked Positive Channel Metal Oxide Semiconductor (PMOS) transistors and two stacked Negative Channel Metal Oxide Semiconductor (NMOS) transistors. The first PMOS transistor P1 has its source connected to the on-chip voltage OVDD, its gate connected to the output end of the input-output level converter 105, and its drain connected to the source of the second PMOS transistor P2, and the gate of the second PMOS transistor P2 is connected to the bias voltage output, pbias, of the adjusting circuit 102. The drain of the second PMOS transistor P2 is connected to a source of the first NMOS transistor N1 via one or more resistors, and the gate of the first NMOS transistor N1 is connected to 1.8V, the drain of the first NMOS transistor N1 is connected to the source of the second NMOS transistor N2, the gate of the second NMOS transistor N2 is connected to the output end of the input-output level converter 105, and the drain of the second NMOS transistor N2 is connected to the ground.

The input-output level converter 105 receives the input driving enabling signal coreinput Drv_en, and outputs the converted voltage, so as to an input appropriate voltage to the gate of the first PMOS transistor P1 and the gate of the second NMOS transistor N2 of the gate stress protection circuit 103.

The adjusting circuit 102 in the driving system 100 can also change the threshold of one or more thin film transistors in the receiver circuit 104 by outputting a threshold control signal Vth_ctrl according to the detected present amplitude of the on-chip voltage, so that the threshold of the thin film transistors can change with the amplitude of the on-chip voltage to ensure the normal turn-on and turn-off of the thin film transistors. The receiver circuit 104 receives the on-chip voltage, padio.

Embodiments of two specific example circuits of the adjusting circuit 102 are described below. Of course, under the teaching and enlightenment of this application, the adjusting circuit 102 can be designed to include other circuit structures to achieve the purpose of adjustment.

Figure 3:
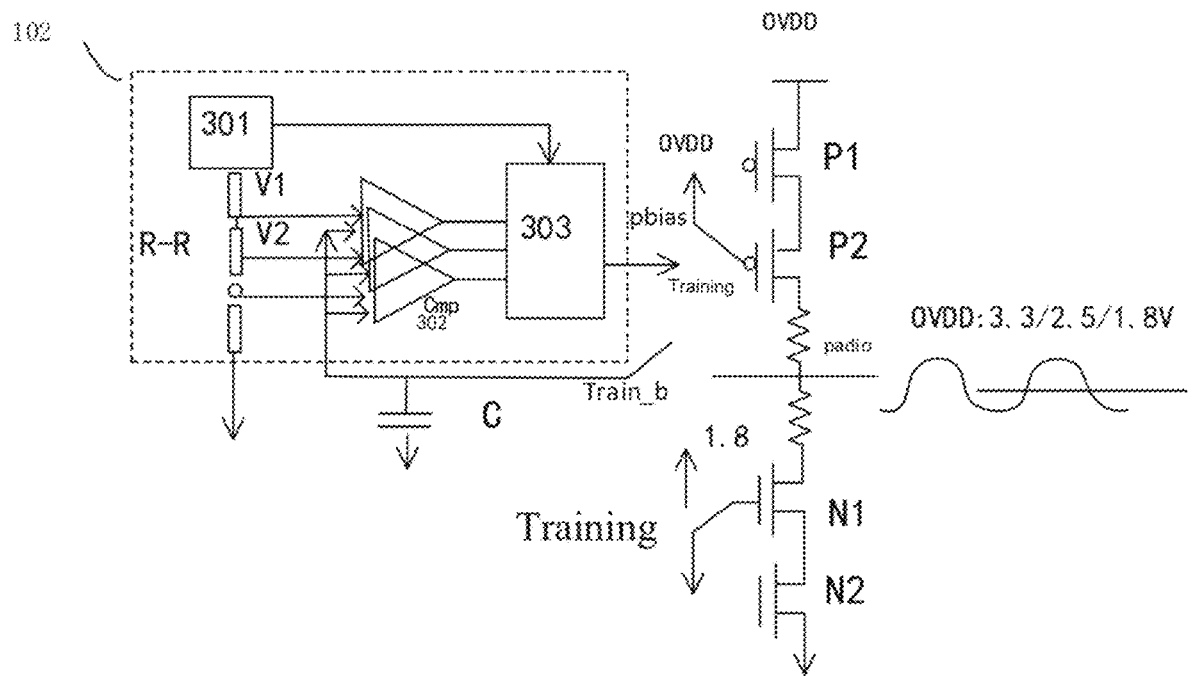
FIG. 3 illustrates a first embodiment of a circuit structure diagram of an adjusting circuit according to an embodiment of the present application.

FIG. 3 illustrates a first embodiment of a circuit structure diagram of the adjusting circuit 102 according to an embodiment of the present application.

The adjusting circuit 102 includes: a reference voltage generator 301, configured to output a plurality of reference voltages related to N selectable amplitudes of the on-chip voltage; a plurality of comparators (cmp) 302, each configured to compare the on-chip voltage output by the input circuit 101 with a corresponding reference voltage and to output the comparison result; a decision maker 303, configured to determine a mode related to the present amplitude of the on-chip voltage output by the input circuit 101 detected from N modes related to the N selectable amplitudes of the on-chip voltage based on the comparison results of the plurality of comparators 302, and to output a bias voltage corresponding to the mode to a gate of the driven thin film transistor according to the detected mode, wherein a source of the thin film transistor is directly or indirectly coupled to the on-chip voltage, and the bias voltage is lower than the on-chip voltage, wherein N is a positive integer greater than 1.

That is, by comparing the on-chip voltage with a plurality of reference voltages, the approximate range of the on-chip voltage can be determined, thereby determining the amplitude of the on-chip voltage among the selectable amplitudes 3.3V, 2.5V, 1.8V, etc.

The values of the respective reference voltage can be determined based on various selectable amplitude values of the on-chip voltage. In an embodiment, the amplitude of each of the plurality of reference voltages may be an intermediate voltage between two adjacent selectable amplitudes of the N selectable amplitudes.

For example, when the on-chip voltage is one of the following selectable amplitudes: 3.3V, 2.5V and 1.8V, the reference voltages may be: (3.3+2.5)/2=2.9V and (2.5+1.8)/2=2.15V, two reference voltages. Therefore, if the comparator 302 determines that the received on-chip voltage is greater than 2.9V, then the decision maker 303 determines that the present amplitude of the on-chip voltage is 3.3V; if the comparator 302 determines that the on-chip voltage is less than 2.9V but greater than 2.15V, then the decision maker 303 determines that the present amplitude of the received on-chip voltage is 2.5V; and if the comparator 302 determines that the received on-chip voltage is less than 2.15V, then the decision maker 303 determines that the present amplitude of the on-chip voltage is 1.8V.

In addition, in one embodiment, the input circuit 101 includes an averaging circuit configured to average the on-chip voltage and output the averaged on-chip voltage. Here, if the input on-chip voltage is a periodic wave with a maximum amplitude of 3.3V, 2.5V or 1.8V, an averaging circuit is used to average the on-chip voltage, and a stable level can be obtained for comparison with each reference voltage. The averaged on-chip voltages corresponding to periodic waves of 3.3V, 2.5V and 1.8V are theoretically, for example, 1.65V, 1.25V and 0.9V. There may be two reference voltages: (1.65+1.25)/2=1.45V and (1.25+0.9)/2=1.075V. Therefore, if the comparator determines that the received averaged on-chip voltage is greater than 1.45V, then the decision maker determines that the present amplitude of the on-chip voltage is 3.3V; if the comparator determines that the received averaged on-chip voltage is less than 1.45V but greater than 1.075V, then the decision maker determines that the present amplitude of the on-chip voltage is 2.5V; if the comparator determines that the received averaged on-chip voltage is less than 1.075V, then the decision maker determines that the present amplitude of the on-chip voltage is 1.8V.

Of course, the magnitude and quantity of the above-mentioned reference voltages are only examples. Taking the average value between two voltages to be judged as the reference voltage can eliminate the judgment error caused by the fluctuation or error of the two voltages. Of course, the magnitude of the reference voltage can change as long as the voltages with two different levels can be judged with appropriate accuracy. In addition, in the above example, two reference voltages are used to judge the magnitudes of three voltages, but actually other quantities of reference voltages, such as three reference voltages, may be used. In the example where the theoretical values of the averaged on-chip voltages are, such as 1.65V, 1.25V and 0.9V, reference voltages of 1.6V, 1.2V and 0.8V may be used. For example, if it is judged that the received averaged on-chip voltage is greater than 1.6V, then the decision maker determines that the present amplitude of the on-chip voltage is 3.3V; if it is judged that the received averaged on-chip voltage is less than 1.6V but greater than 1.2V, then the decision maker determines that the present amplitude of the on-chip voltage is 2.5V; if it is judged that the received averaged on-chip voltage is less than 1.2V but greater than 0.8V, then the decision maker determines that the present amplitude of the on-chip voltage is 1.8V. Of course, if it is judged that the received averaged on-chip voltage is less than 0.8V, the decision maker can ignore the comparison result or determine that no on-chip voltage is input, and this is simply due to the error or fluctuation. There may be many examples of the magnitude and the quantity of reference voltages, which are not described in detail here.

In one embodiment, the averaging circuit for averaging the on-chip voltage includes at least one capacitor and at least one resistor. As shown in FIG. 3, a resistor-capacitor (RC) oscillator is formed as an averaging circuit for averaging voltages by using a grounded capacitor (having a capacitance value C) and an unshown resistor (having a resistance value R) (including e.g., the resistance of the wire itself and/or a separate resistor, etc.) Here, the capacitance value C and the resistance value R of the capacitor are determined so that the frequency of the RC oscillator is basically the same as or matched with the frequency of the periodic wave of the input on-chip voltage, so that the RC oscillation compensates the period of the on-chip voltage and the averaging circuit outputs the voltage and the level as stable as possible. The greater the capacitance value is, the lower the oscillation frequency is, and the smaller the capacitance value is, the higher the oscillation frequency is. For example, the capacitance value C is 1-5 F (farad), which, of course, is not limited thereto. In addition, the averaging circuit may also be replaced with other circuits, such as a rectifier circuit, an integrating circuit, etc., as long as the averaging circuit can output a voltage and a level as stable as possible, which are not described in detail here.

In order to realize the above comparison and decision-making more simply, digital methods instead of analog methods can be adopted. A series of digital signals, such as 0 or 1, are obtained through the above comparison. Specifically, each of the plurality of comparators outputs a first value, such as binary 1, when the on-chip voltage is greater than a corresponding reference voltage, and outputs a second value, such as binary 0, when the on-chip voltage is less than or equal to a corresponding reference voltage, wherein each of the N modes corresponds to one of a plurality of possible codes consisting of the first values and/or the second values. That is, after comparison, a string composed of, for example, 0s and 1s, can be obtained. Since the on-chip voltages with different amplitudes will get completely different strings composed of 0s and 1s after being processed by a plurality of comparators, different modes can be determined through the differences between such strings.

Specifically, the output results are result codes composed of first values and/or second values output by a plurality of comparators, and the decision maker is configured to determine the mode corresponding to the result code from the N modes according to the result codes. When the first value is binary 1 and the second value is binary 0, and for example, when three reference voltages are used, the mode corresponding to 3.3V corresponds to a result code: 111, because 3.3V is greater than three reference voltages; the mode corresponding to 2.5V corresponds to a result code: 011, because 2.5V is greater than two of the three reference voltages and less than the largest reference voltage; the mode corresponding to 1.8V corresponds to a result code: 001, because 1.8V is greater than one of the three reference voltages and less than the largest 2 reference voltages.

Of course, the above examples illustrate 3 selectable amplitudes of the on-chip voltages, 3 reference voltages, 3 comparators, and 3-bit result codes, but in fact, other quantities of reference voltages and result codes with other number of bits may be selected according to the number of selectable amplitudes of the on-chip voltages. Alternatively, 3 selectable amplitudes of the on-chip voltages may correspond to 2 reference voltages, 2 comparators and 2-bit result codes. For example, the mode corresponding to 3.3V corresponds to a result code: 11, because 3.3V is greater than 2 reference voltages; the mode corresponding to 2.5V corresponds to a result code: 01 because 2.5V is greater than one of the 2 reference voltages but less than the largest reference voltage; the mode corresponding to 1.8V corresponds to a result code: 00 because 1.8V is less than 2 reference voltages. It is also possible to distinguish the three voltage amplitudes through such comparison. Here, not all embodiments are included, but embodiments that conform to the principles of this application and can achieve the effects of this application are understood to be included in this application.

In an embodiment, the reference voltage generator 301 is a bandgap reference power source (BG), the comparators is analog-to-digital converters (ADCs), and the decision maker is a digital-to-analog converter (DAC). That is, a plurality of reference voltages are generated by a conventional bandgap reference power source. And comparators can convert the comparison results into binary digits of 0s and/or 1s, and a decision maker can convert these binary digits into a bias voltage corresponding to the mode corresponding to these binary digits.

Examples of the bias voltage may be that: the bias voltage is set to 0V if the amplitude of the on-chip voltage is 1.8V; the bias voltage is set to ¼ of the on-chip voltage (i.e., 0.625V) if the amplitude of the on-chip voltage is 2.5V; and the bias voltage is set to ⅓ of the on-chip voltage (i.e., 1.1V) if the amplitude of the on-chip voltage is 3.3V. Of course, the above only gives an example of the bias voltage, which is not limited to these examples in this application. In fact, other bias voltages may also be feasible. For example, a different ratio of the bias voltage to the on-chip voltages or a fixed different bias voltage may be given based on different on-chip voltages according to the detection results of on-chip voltages, and the same ratio or fixed value may also be set to be applied to detected different on-chip voltage results. These adjusted bias voltages depend on the manufacture process to avoid gate stress at the output driver.

Figure 4A:
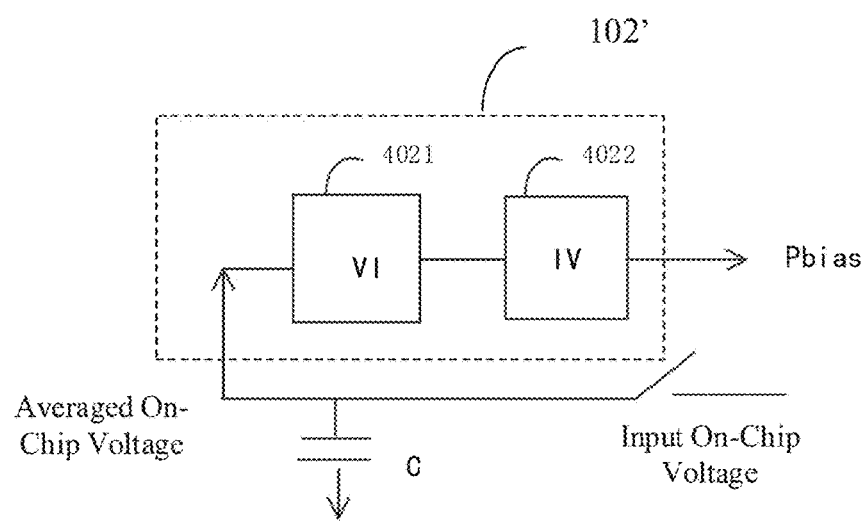
FIG. 4A illustrates a second embodiment of a circuit structure diagram of an adjusting circuit according to an embodiment of the present application.
Figure 4B:
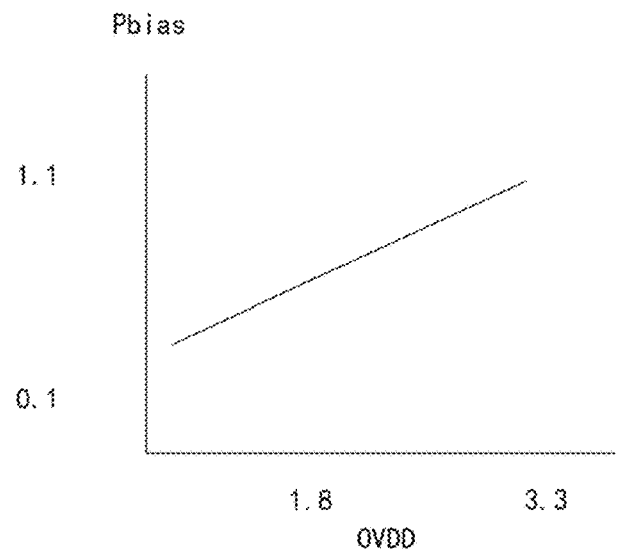
FIG. 4B illustrates a diagram showing the amplitude relationship between the input voltage and the output voltage of the adjusting circuit shown in FIG. 4A.

FIG. 4A illustrates a second embodiment of a circuit structure diagram of an adjusting circuit 102'. FIG. 4B illustrates a diagram showing the amplitude relationship between the input voltage and the output voltage of the adjusting circuit 102' shown in FIG. 4A. As shown in FIG. 4B, for example, the bias voltage Pbias is set to be ⅓ of the input voltage OVDD, that is, when OVDD is 3.3V, the bias voltage Pbias is 1.1V; when OVDD is 1.8V, the bias voltage Pbias is 0.6V, etc. Of course, what FIG. 4B shows is a linear relationship, but in fact, the amplitude relationship is not limited to this, and other amplitude relationships between the input voltage and the output voltage may also be adopted.

The adjusting circuit 102' is a V/I and I/V conversion circuit, and is configured to output a corresponding bias voltage based on the on-chip voltage output by the input circuit 101 according to an input-output relationship between the on-chip voltage and the bias voltage.

In an embodiment, the V/I and I/V conversion circuit includes: a V/I conversion circuit 4021, configured to convert an input on-chip voltage into a current signal; and an I/V conversion circuit 4022, configured to convert the current signal into a corresponding bias voltage.

As we all know, the V/I and I/V conversion circuit can increase or decrease the voltage. If the input on-chip voltage is converted into a lower output bias voltage, for example, in the previous example, the bias voltage is set to 0V if the amplitude of the on-chip voltage is 1.8V, the bias voltage is set to ¼ of the on-chip voltage if the amplitude of the on-chip voltage is 2.5V; and the bias voltage is set to ⅓ of the on-chip voltage if the amplitude of the on-chip voltage is 3.3V. Or, regardless of the amplitude of the on-chip voltage, the input on-chip voltage is reduced to ¼ or ⅓ of the on-chip voltage or other values.

Figure 5A:
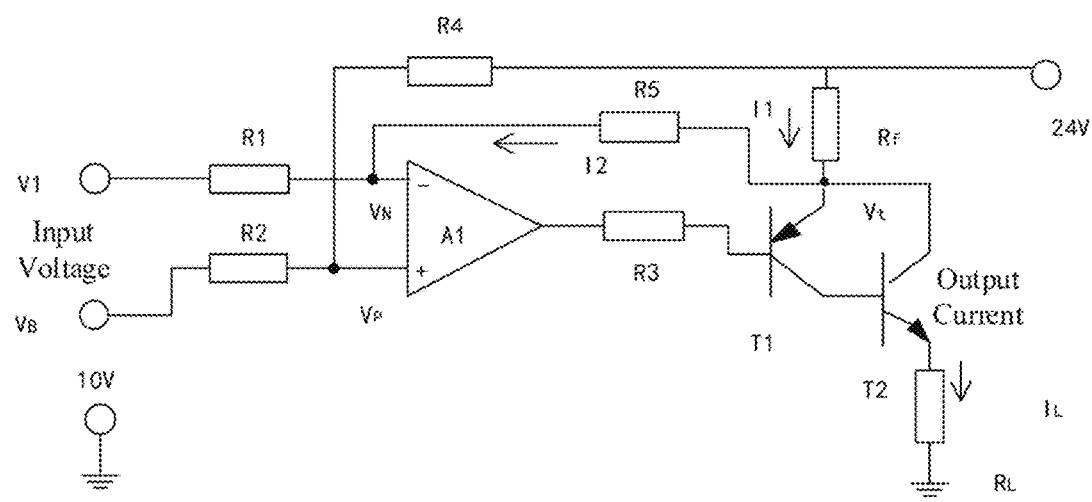
FIG. 5A illustrates an example circuit diagram of a V/I conversion circuit according to an embodiment of the present application.
Figure 5B:
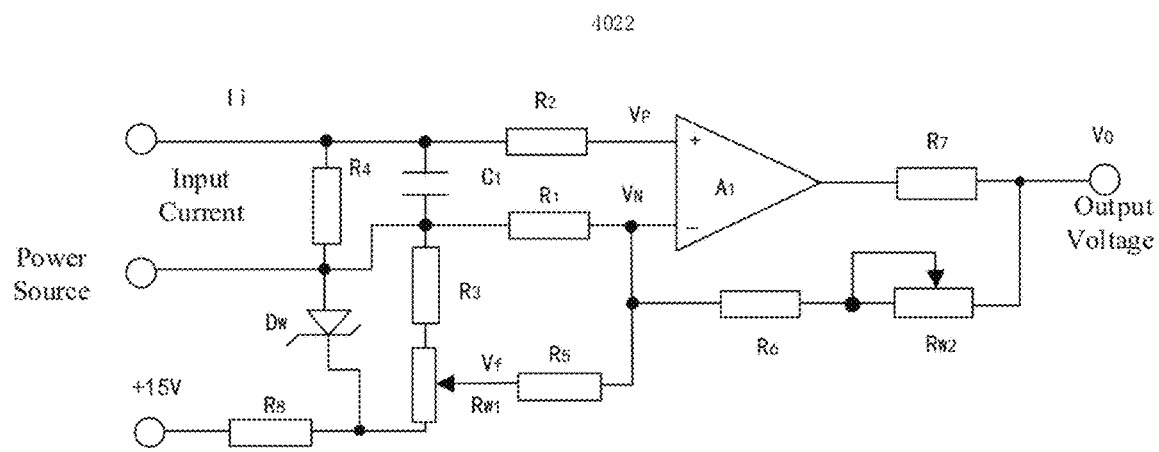
FIG. 5B illustrates an example circuit diagram of an IN conversion circuit according to an embodiment of the present application.

FIG. 5A illustrates a circuit diagram of an example V/I conversion circuit 4021 according to an embodiment of the present application. FIG. 5B illustrates a circuit diagram of an example I/V conversion circuit 4022 according to an embodiment of the present application.

It can be seen that through setting the resistance value of each resistor, the V/I conversion circuit 4021 can convert an input voltage into an output current, and input the output current to the I/V conversion circuit 4022, thereby converting the current into an output voltage. Here, any input voltage can be converted into any output voltage. Here, the specific values of each resistor, capacitor, etc. are not elaborated, so as to simplify the description. In fact, the skilled person in this field can set the specific values of each resistor, capacitor, etc. to convert any input voltage into any output voltage. Of course, the circuit diagram of the above conversion circuit is only an example. In fact, more conversion circuits can be realized by combination of operational amplifiers, capacitors and resistors. Furthermore, the above-mentioned bias voltage values are also examples. In fact, in order to protect the gate of the thin film transistor, it is also possible to set bias voltages of other values and design a corresponding V/I and I/V conversion circuit.

Figure 6:
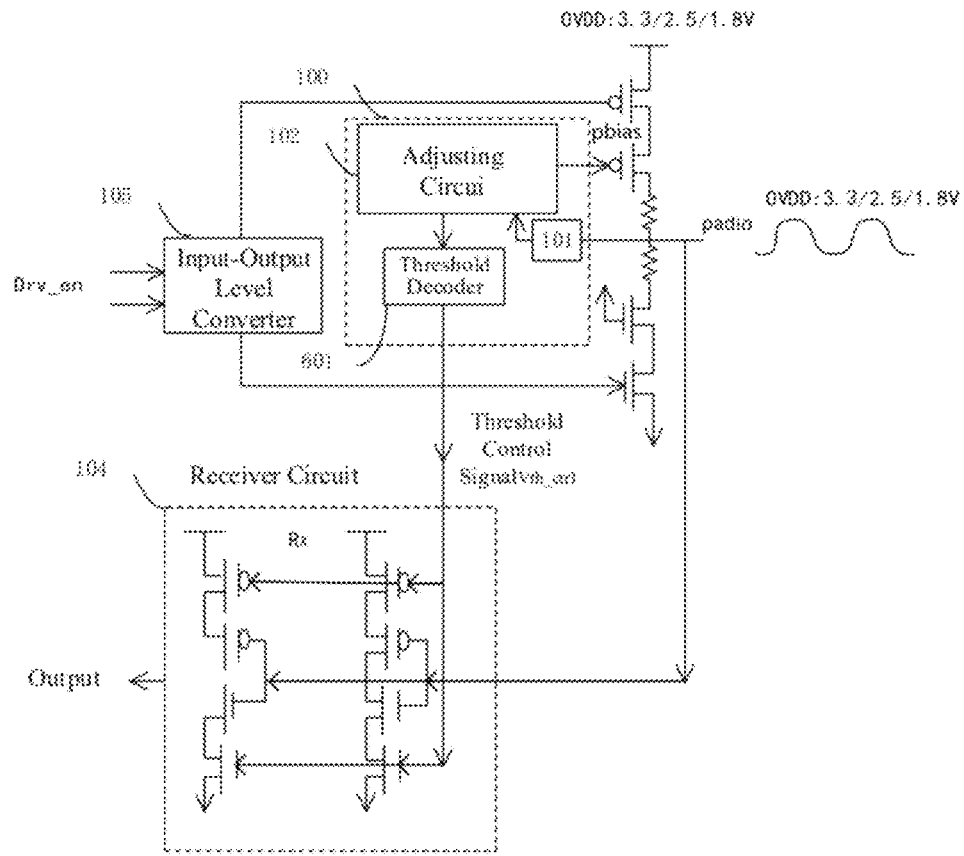
FIG. 6 illustrates another embodiment of a driving system according to an embodiment of the present application.

FIG. 6 illustrates another embodiment of a driving system 100 according to an embodiment of the present application.

In this embodiment, the driving system 100 further includes: a threshold decoder 601, configured to set the gates of some thin film transistors in the receiver to threshold voltages corresponding to the detected mode based on the detected mode, wherein the gate voltages of other thin film transistors in the receiver are the on-chip voltages.

In an embodiment, the threshold voltage for the on-chip voltage with an amplitude of 1.8V is set to 0.9V, the threshold voltage for the on-chip voltage with an amplitude of 2.5V is set to 1.25V, and the threshold voltage for the on-chip voltage with an amplitude of 3.3V is set to 1.65V. Of course, the value of the threshold voltage is only an example. In fact, the threshold voltage of the transistor may be set to an appropriate value as long as the transistors can be normally turned on and off for the on-chip voltages with different amplitudes.

Because of the different amplitudes of the on-chip voltages, the threshold voltages of the transistors in the receiver should accordingly be set differently, otherwise, the transistors may be unable to be driven to turn on normally, or may be over-driven. Of course, the circuit diagram of the receiver shown in FIG. 6 is only an example. In fact, other circuit diagrams are also feasible, as long as the threshold voltage involved can be set to change with the amplitude of the on-chip voltage by the threshold decoder 601.

In order to output a preset bias voltage or a preset threshold voltage based on a preset amplitude of the on-chip voltage output by the input circuit 101, the training operation may be performed before the normal adjustment operation. In an embodiment, the driving system includes a switch group configured to connect with the preset on-chip voltage (e.g., 3.3V, 2.5V, or 1.8V) and disconnect the coupling with the thin film transistors P2 and N1 in the training period, so as to turn off the thin film transistors P2 and N1. For example, the gate of the transistor P2 is disconnected from the bias voltage pbias and connected to OVDD, and the gate of the transistor N1 is disconnected from the 1.8V voltage. Herein, the training is to output preset bias voltages (for example, ⅓ of the on-chip voltage (i.e., 1.1V), ¼ of the on-chip voltage (i.e., 0.625V)), 0V or other preset threshold voltages based on the preset amplitude of the on-chip voltage output by the input circuit 101.

Here, the training may include adjusting the level of each reference voltage generated by a reference voltage generator 301 (e.g., a bandgap reference power source) in the first embodiment of the adjusting circuit, so that the corresponding mode and then the corresponding bias voltage can be correctly determined through the comparison with the reference voltage, or may include adjusting the values of resistors in the V/I conversion circuit and I/V conversion circuit in the second embodiment of the adjusting circuit, so that the corresponding output bias voltage can be obtained from the input on-chip voltage.

In this way, after training and adjusting, the switch group is configured to connect the coupling with the thin film transistor in the normal operation period. For example, the gate of the transistor N2 is connected with pbias, and the gate of the transistor P1 is connected with a voltage of 1.8V, so as to normally detect the present amplitude of the on-chip voltage and output the corresponding bias voltage and threshold voltage.

Different circuit structures of the threshold decoder 601 may be designed to realize the above-mentioned operations of setting a corresponding threshold voltage based on the detected mode, and are not described in detail herein.

An example circuit structure of the receiver circuit 104 may be shown in FIG. 6. The receiver circuit 104 includes, for example, four PMOS transistors and four NMOS transistors. Herein sources and drains of the two PMOS transistors and the two NMOS transistors are connected end to end, i.e., the source of the first PMOS transistor is connected to the power source voltage, the drain of the first PMOS transistor is connected to the source of the second PMOS transistor; the drain of the second PMOS transistor is connected to the source of the first NMOS transistor; the drain of the first NMOS transistor is connected to the source of the second NMOS transistor; and the drain of the second NMOS transistor is connected to the ground. The input on-chip voltage, padio, i.e., the input OVDD, is connected to the gates of two PMOS transistors and two NMOS transistors of the receiver circuit 104. While the threshold voltage output by the threshold decoder 601 is input to the gates of the two first PMOS transistors and two second NMOS transistors. The purpose is to control the threshold voltages of these transistors to match the gate voltages of other transistors (padio or on-chip voltage OVDD), so that the transistor can be normally turned on when the voltage between the source and the gate of the transistor exceeds the threshold voltage, and the transistor can be normally turned off when the voltage between the source and the gate of the transistor is lower than the threshold voltage.

The circuit structure diagram of the receiver circuit 104 shown in FIG. 6 is only an example. In fact, other circuit structures are also feasible as long as the threshold decoder 601 outputs an appropriate threshold voltage to the receiver. In addition, FIG. 6 shows that the threshold decoder 601 is a separate device outside the adjusting circuit 102, but this is only an example. In fact, the threshold decoder 601 may also be designed inside the adjusting circuit 102 as a part of the adjusting circuit, which is not limited.

Figure 7:
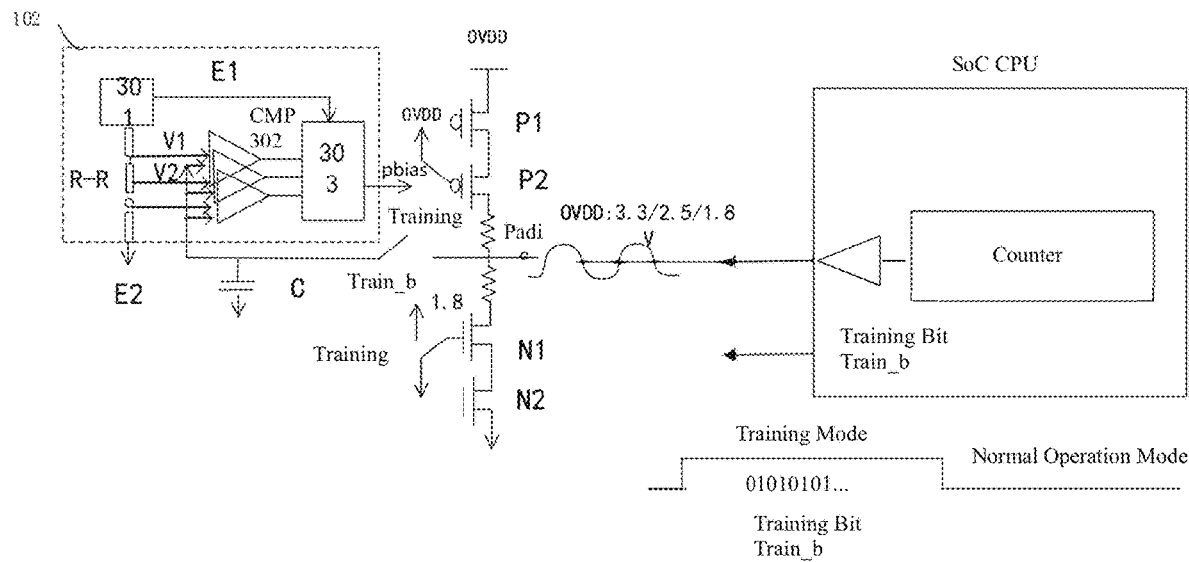
FIG. 7 illustrates counter operations and input pulses in a training mode and a normal operation mode according to an embodiment of the present application.

FIG. 7 illustrates counter operations and input pulses in a training mode and a normal operation mode according to an embodiment of the present application.

In this embodiment, the training period may be controlled by a counter, and during a counting period of the counter, a series of training mode pulses (e.g., 010101 . . . ) with a low level and a high level alternating with each other are generated so that the on-chip voltage received by the input circuit 101 is a periodic wave. Herein, the signal, Train_b, when being 1, indicates to connect the series of training mode pulses (e.g., 010101 . . . ) to an averaging circuit (e.g., an RC oscillator) to be averaged. The frequency of the periodic wave is, for example, 100 MHz, and is not limited to this. And when the counting of the counter ends, the training mode pulses change to a low level, indicating the start of a normal operation period. Of course, the counter, a series of training mode pulses with a low level a the high level alternating with each other, and the low level are all examples, and other methods may be used to control the training period and normal operation period, such as timers.

Here, the timing of the automatic training and normal operation can be set by using input pulses to guide the training mode and the normal operation mode. Of course, other methods may also be used to guide the training mode and the normal operation mode, for example, different indication signals may be used to trigger different modes.

Therefore, according to various embodiments of the present application, the protection of transistor gate and the adjusting of the receiver threshold voltage for different I/O (input/output) voltages and levels can be completed through automatic detection of the on-chip voltage and automatic adjusting.

Figure 8:
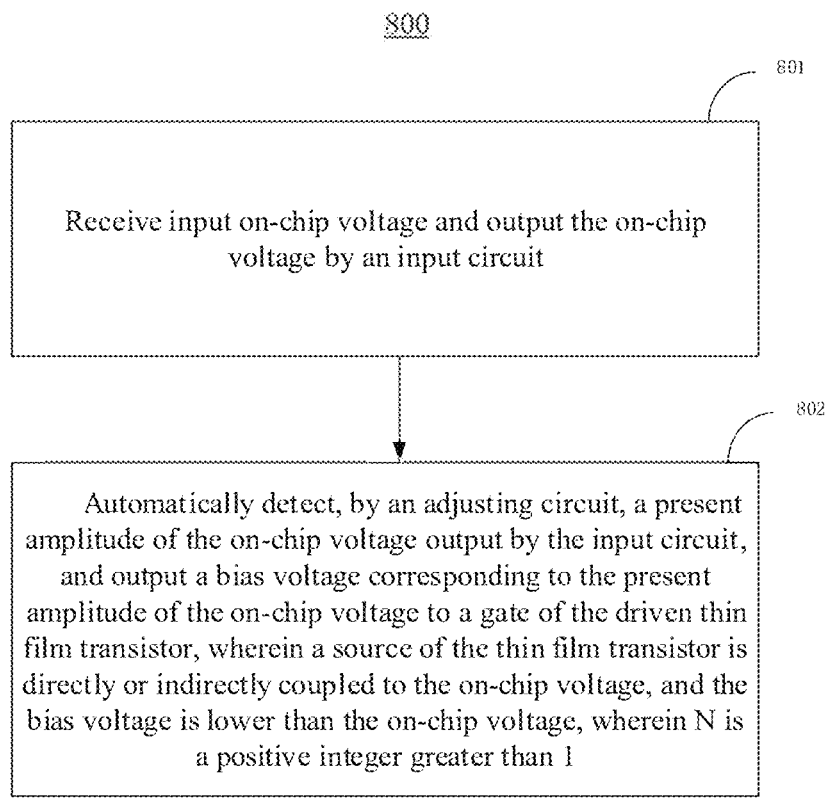
FIG. 8 illustrates a flowchart of a driving method for automatically detecting an on-chip voltage to adjust a gate voltage of a thin film transistor according to an embodiment of the present application.

FIG. 8 illustrates a flowchart of a driving method 800 for automatically detecting an on-chip voltage to adjust a gate voltage of a thin film transistor according to an embodiment of the present application.

The driving method 800 includes: an input step 801, in which an input circuit receives an input on-chip voltage and outputs the on-chip voltage; and an adjustment step 802, in which the adjusting circuit automatically detects a present amplitude of the on-chip voltage output by the input circuit, and outputs a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage.

In an embodiment, the adjusting step 802 includes: outputting a plurality of reference voltages related to N selectable amplitudes of the on-chip voltage by a reference voltage generator; comparing the on-chip voltage output by the input circuit with a corresponding reference voltage by a plurality of comparators, and outputting comparison results; determining, by a decision maker, a mode related to the present amplitude of the on-chip voltage output by the input circuit from N modes related to the N selectable amplitudes of the on-chip voltage based on the comparison results of the plurality of comparators, and outputting a bias voltage corresponding to the detected mode to a gate of the driven thin film transistor according to the detected mode, wherein the source of the thin film transistor is directly or indirectly coupled to the on-chip voltage, and the bias voltage is lower than the on-chip voltage, wherein N is a positive integer greater than 1.

In an embodiment, the amplitude of each of the plurality of reference voltages is an intermediate voltage between two adjacent selectable amplitudes of the N selectable amplitudes, and the step of comparing the on-chip voltage output by the input circuit with a corresponding reference voltage by a plurality of comparators and outputting comparison results comprises: outputting, by each of the plurality of comparators, a first value when the on-chip voltage is greater than a corresponding reference voltage; and outputting a second value when the on-chip voltage is less than or equal to a corresponding reference voltage, wherein each of the N modes corresponds to one of a plurality of possible codes composed of the first values and/or the second values; wherein the output result is a result code composed of first values and/or second values output by a plurality of comparators. The step of determining the mode by the decision maker based on the comparison results of the plurality of comparators includes: determining the mode corresponding to the result code from the N modes by the decision maker according to the result code.

In one embodiment, the reference voltage generator is a bandgap reference power source, the first value is a binary 1, the second value is a binary 0, the comparator is an analog-to-digital converter, and the decision maker is a digital-to-analog converter.

In an embodiment, the bias voltage is set to 0V if the amplitude of the on-chip voltage is 1.8V, the bias voltage is set to ¼ of the on-chip voltage if the amplitude is 2.5V, and the bias voltage is set to ⅓ of the on-chip voltage if the amplitude is 3.3V.

In an embodiment, the adjusting step 802 includes: outputting the corresponding bias voltage based on the on-chip voltage output by the input circuit according to an input-output relationship between the on-chip voltage and the bias voltage by the V/I and I/V conversion circuit.

In one embodiment, the step of outputting a corresponding bias voltage based on the on-chip voltage output by the input circuit according to an input-output relationship between the on-chip voltage and the bias voltage by the V/I and I/V conversion circuit includes: converting the input on-chip voltage into a current signal by the V/I conversion circuit; and converting the current signal into a corresponding bias voltage by an I/V conversion circuit.

In one embodiment, the bias voltage is set to ⅓ of the on-chip voltage.

In one embodiment, the input step 801 includes averaging the on-chip voltage with an averaging circuit and outputting the averaged on-chip voltage.

In one embodiment, the averaging circuit includes at least one capacitor and at least one resistor.

In one embodiment, the method further comprises: setting the gates of some thin film transistors in the receiver to threshold voltages corresponding to the detected mode by a threshold decoder based on the detected mode, wherein the gate voltages of other thin film transistors in the receiver are the on-chip voltages.

In one embodiment, the threshold voltage for the on-chip voltage with an amplitude of 1.8V is set to 0.9V, the threshold voltage for the on-chip voltage with an amplitude of 2.5V is set to 1.25V, and the threshold voltage for the on-chip voltage with an amplitude of 3.3V is set to 1.65V.

In one embodiment, the driving method further comprises connecting with the on-chip voltage and disconnecting the coupling with the thin film transistor during a training period so as to turn off the thin film transistor, wherein the training is to output a preset bias voltage or a preset threshold voltage based on the preset amplitude of the on-chip voltage output by the input circuit, and connecting the coupling with the thin film transistor during a normal operation period by the switch group.

In one embodiment, the training period is controlled by a counter, and during a counting period of the counter, a series of training mode pulses with a low level and a high level alternating with each other are generated, so that the on-chip voltage received by the input circuit is a periodic wave, and when the countering of the counter ends, the training mode pulses change into a low level, indicating the start of the normal operation period.

Therefore, according to various embodiments of the present application, the protection of transistor gate and the adjusting of the receiver threshold voltage for different I/O (input/output) voltages and levels can be completed through automatic detection of the on-chip voltage and automatic adjusting.

Figure 9:
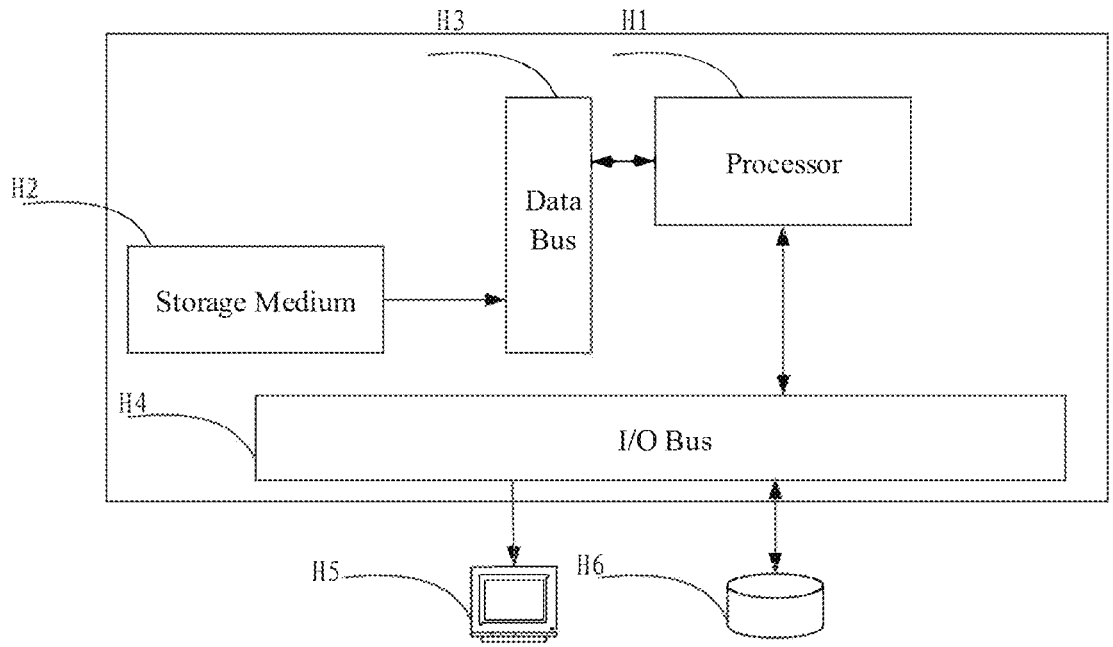
FIG. 9 illustrates a block diagram of an exemplary computer system applicable to implementing embodiments of the present invention.

FIG. 9 illustrates a block diagram of an exemplary computer system applicable to implementing embodiments of the present invention.

The computer system may include: a processor H1; and a memory H2 coupled to the processor H1 and storing therein computer-executable instructions for performing the steps of the respective methods of the embodiments of the present invention when executed by the processor.

The processor H1 may include, but is not limited to, one or more processors or microprocessors, for example.

The memory H2 may include, but is not limited to, a random access memory (RAM), a Read-Only Memory (ROM), a flash memory, an EPROM memory, an EEPROM memory, a register, and a computer storage medium (such as hard disk, floppy disk, solid-state disk, removable disk, CD-ROM, DVD-ROM, Blu-ray disk, etc.).

In addition, the computer system may further include a data bus H3, an input/output (I/O) bus H4, a display H5, and an input/output device H6 (e.g., keyboard, mouse, speaker, etc.), etc.

The processor H1 can communicate with external devices H5, H6, etc. via a wired or wireless network (not shown) through an I/O bus H4.

The memory H2 may also store at least one computer-executable instruction for performing various functions and/or steps of the methods in the embodiments described in the present technology when executed by the processor (H1).

In one embodiment, the at least one computer-executable instruction may also be compiled into or constitute a software product, wherein the one or more computer-executable instruction performs various functions and/or steps of methods in the embodiments described in the present technology when being executed by the processor.

Figure 10:
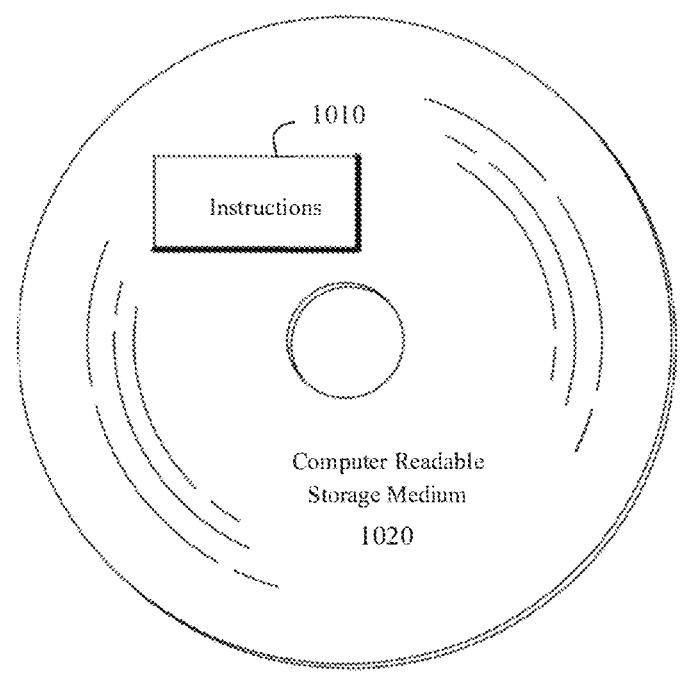
FIG. 10 illustrates a schematic diagram of a non-transitory computer-readable storage medium according to an embodiment of the present disclosure.

FIG. 10 illustrates a schematic diagram of a non-transitory computer-readable storage medium according to an embodiment of the present disclosure.

As shown in FIG. 10, the computer-readable storage medium 1020 stores instructions, such as computer-readable instructions 1010. When the computer readable instructions 1010 are executed by a processor, the driving method described with reference to the above figures may be performed. The computer readable storage medium includes, but are not limited to, a volatile memory and/or a nonvolatile memory, for example. The volatile memory may include a random access memory (RAM) and/or a cache memory, for example. The nonvolatile memory may include, for example, a Read-Only Memory (ROM), a hard disk, a flash memory, etc. For example, the computer-readable storage medium 1020 may be connected to a computing device such as a computer, and then, when the computing device executes the computer-readable instructions 1010 stored on the computer-readable storage medium 1020, the driving method as described above may be performed.

The application provides the following aspects:

Aspect 1. A driving system for automatically detecting an on-chip voltage to adjust a gate voltage of a thin film transistor, comprising:

an input circuit, configured to receive an input on-chip voltage and output the on-chip voltage; and an adjusting circuit, configured to automatically detect a present amplitude of the on-chip voltage output by the input circuit and to output a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage.

Aspect 2. The system according to aspect 1, wherein the adjusting circuit comprises:
a reference voltage generator, configured to output a plurality of reference voltages related to N selectable amplitudes of the on-chip voltage;
a plurality of comparators, each configured to compare the on-chip voltage output by the input circuit with a corresponding reference voltage and output comparison results; and
a decision maker, configured to determine a mode related to a present amplitude of the on-chip voltage output by the input circuit from N modes related to the N selectable amplitudes of the on-chip voltage based on the comparison results of the plurality of comparators, and output a bias voltage corresponding to the detected mode to a gate of the driven thin film transistor according to the detected mode,
wherein the source of the thin film transistor is directly or indirectly coupled to the on-chip voltage, and the bias voltage is lower than the on-chip voltage, wherein N is a positive integer greater than 1.

Aspect 3. The system according to aspect 2, wherein the amplitude of each of the plurality of reference voltages is an intermediate voltage between two adjacent selectable amplitudes of the N selectable amplitudes,
each of the plurality of comparators outputs a first value when the on-chip voltage is greater than a corresponding reference voltage, and outputs a second value when the on-chip voltage is less than or equal to the corresponding reference voltage, wherein each of the N modes corresponds to one of a plurality of possible codes consisting of the first values and/or the second values;
the output result is a result code composed of first values and/or second values output by the plurality of comparators,
the decision maker is configured to determine the mode corresponding to the result code from the N modes according to the result code.

Aspect 4. The system according to aspect 3, wherein the reference voltage generator is a bandgap reference power source, the first value is a binary 1, the second value is a binary 0, the comparator is an analog-to-digital converter, and the decision maker is a digital-to-analog converter.

Aspect 5. The system according to aspect 1, wherein the bias voltage is set to 0V if the amplitude of the on-chip voltage is 1.8V, the bias voltage is set to ¼ if the amplitude of the on-chip voltage is 2.5V, and the bias voltage is set to ⅓ if the amplitude of the on-chip voltage is 3.3V.

Aspect 6. The system according to aspect 1, wherein the adjusting circuit comprises:
a V/I and I/V conversion circuit, configured to output a corresponding bias voltage based on the on-chip voltage output by the input circuit according to an input-output relationship between the on-chip voltage and the bias voltage.

Aspect 7. The system according to aspect 6, wherein the V/I and I/V conversion circuit comprise:
a V/I conversion circuit, configured to convert the input on-chip voltage into a current signal; and
an I/V conversion circuit, configured to convert the current signal into a corresponding bias voltage.

Aspect 8. The system according to aspect 1, wherein the adjusting circuit comprises:
a plurality of resistors for dividing the input on-chip voltage to output a divided voltage.

Aspect 9. The system according to aspect 1, wherein the bias voltage is set to be ⅓ of the on-chip voltage.

Aspect 10. The system according to aspect 1, wherein the input circuit comprises an averaging circuit configured to average the on-chip voltage and output the averaged on-chip voltage.

Aspect 11. The system according to aspect 10, wherein the averaging circuit comprises at least one capacitor and at least one resistor.

Aspect 12. The system according to aspect 1, wherein the adjusting circuit further comprises: a threshold decoder, configured to set gates of a part of thin film transistors in the receiver to threshold voltages corresponding to the detected mode based on the detected mode, wherein the gate voltages of other thin film transistors in the receiver are the on-chip voltages.

Aspect 13. The system according to aspect 12, wherein the threshold voltage for the on-chip voltage with an amplitude of 1.8V is set to 0.9V, the threshold voltage for the on-chip voltage with an amplitude of 2.5V is set to 1.25V, and the threshold voltage for the on-chip voltage with an amplitude of 3.3V is set to 1.65V.

Aspect 14. The system according to aspect 1 or 13, wherein the driving system comprises a switch group configured to connect with an on-chip voltage and disconnect the coupling with a thin film transistor during a training period so as to turn off the thin film transistor, wherein the training is to output a preset bias voltage or a preset threshold voltage based on a preset amplitude of the on-chip voltage output by the input circuit, and the switch group is configured to connect the coupling with the thin film transistor in a normal operation period.

Aspect 15. The system according to aspect 14, wherein the training period is controlled by a counter, and during a counting of the counter, a series of training mode pulses with a low level and a high level alternating with each other are generated so that the on-chip voltage received by the input circuit is a periodic wave,
and when the counting of the counter ends, the training mode pulses change to a low level, indicating the start of the normal operation period.

Aspect 16. A driving method for automatically detecting an on-chip voltage to adjust a gate voltage of a thin film transistor, comprising:
an input step, receiving an input on-chip voltage and outputting the on-chip voltage by an input circuit; and
an adjusting step, automatically detecting a present amplitude of the on-chip voltage output by the input circuit by an adjusting circuit, and outputting a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage.

Aspect 17. The method according to aspect 16, wherein the adjusting step comprises:
Outputting, by a reference voltage generator, a plurality of reference voltages related to N selectable amplitudes of the on-chip voltage;

comparing the on-chip voltage output by the input circuit with a corresponding reference voltage by a plurality of comparators, and outputting comparison results; and determining, by a decision maker, a mode related to a present amplitude of the on-chip voltage output by the input circuit from N modes related to the N selectable amplitudes of the on-chip voltage based on the comparison results of the plurality of comparators, and outputting a bias voltage corresponding to the detected mode to a gate of the driven thin film transistor according to the detected mode, wherein a source of the thin film transistor is directly or indirectly coupled to the on-chip voltage, and the bias voltage is lower than the on-chip voltage, wherein N is a positive integer greater than 1.

Aspect 18. The method according to aspect 17, wherein the amplitude of each of the plurality of reference voltages is an intermediate voltage between two adjacent selectable amplitudes of the N selectable amplitudes, the step of comparing, by a plurality of comparators, the on-chip voltage output by the input circuit with a corresponding reference voltage and outputting comparison results comprises:

outputting, by each of the plurality of comparators, a first value when the on-chip voltage is greater than a corresponding reference voltage, and outputs a second value when the on-chip voltage is less than or equal to a corresponding reference voltage, wherein each of the N modes corresponds to one of a plurality of possible codes composed of the first values and/or the second values;

wherein the output result is a result code composed of first values and/or second values output by the plurality of comparators, wherein the step of determining the mode by a decision maker based on the comparison results of the plurality of comparators comprises:

determining the mode corresponding to the result code from the N modes by the decision maker according to the result code.

Aspect 19. The method according to aspect 18, wherein the reference voltage generator is a bandgap reference power source, the first value is a binary 1, the second value is a binary 0, the comparator is an analog-to-digital converter, and the decision maker is a digital-to-analog converter.

Aspect 20. The method according to aspect 16, wherein the bias voltage is set to 0V if the amplitude of the on-chip voltage is 1.8V, the bias voltage is set to ¼ of the on-chip voltage if the amplitude is 2.5V, and the bias voltage is set to ⅓ of the on-chip voltage if the amplitude is 3.3V.

Aspect 21. The method according to aspect 16, wherein the adjusting step comprises:

outputting, by a V/I and I/V conversion circuit, a corresponding bias voltage based on the on-chip voltage output by the input circuit according to an input-output relationship between the on-chip voltage and the bias voltage.

Aspect 22. The method according to aspect 21, wherein the step of outputting, by the V/I and I/V converter, the corresponding bias voltage based on the on-chip voltage output by the input circuit according to the input-output relationship between the on-chip voltage and the bias voltage comprises:

converting the input on-chip voltage into a current signal by a V/I conversion circuit; and converting the current signal into a corresponding bias voltage by an I/V conversion circuit, or the adjusting step comprises: dividing, by a plurality of resistors, the input on-chip voltage to output a divided voltage.

Aspect 23. The method according to aspect 16, wherein the bias voltage is set to be ⅓ of the on-chip voltage.

Aspect 24. The method according to aspect 16, wherein the input step comprises averaging the on-chip voltage with an averaging circuit and outputting the averaged on-chip voltage.

Aspect 25. The method according to aspect 24, wherein the averaging circuit comprises at least one capacitor and at least one resistor.

Aspect 26. The method according to aspect 16, wherein the method further comprises: setting, by a threshold decoder, gates of a part of thin film transistors in a receiver to threshold voltages corresponding to the detected mode based on the detected mode, wherein gate voltages of other thin film transistors in the receiver are the on-chip voltages.

Aspect 27. The system according to aspect 26, wherein the threshold voltage for the on-chip voltage with an amplitude of 1.8V is set to 0.9V, the threshold voltage for the on-chip voltage with an amplitude of 2.5V is set to 1.25V, and the threshold voltage for the on-chip voltage with an amplitude of 3.3V is set to 1.65V.

Aspect 28. The method according to any one of the preceding aspects, wherein the method further comprises connecting with the on-chip voltage and disconnecting the coupling with the thin film transistor by a switch group in a training period so as to turn off the thin film transistor, wherein the training is to output a preset bias voltage or a preset threshold voltage based on the preset amplitude of the on-chip voltage output by the input circuit, and connecting the coupling with the thin film transistor in a normal operation period by the switch group.

Aspect 29. The method according to aspect 28, wherein the training period is controlled by a counter, and during a counting period of the counter, a series of training mode pulses with a low level and a high level alternating with each other are generated so that the on-chip voltage received by the input circuit is a periodic wave, and when the counting of the counter ends, the training mode pulses change into a low level, indicating the start of the normal operation period.

Aspect 30. A computer system comprising:

processor; and a memory coupled to the processor and storing therein computer executable instructions for performing the driving method according to any one of aspects 16 to 29 when executed by the processor.

Aspect 31. A computer readable medium storing thereon a computer program, wherein the program, when executed by a processor, implements the driving method according to any one of aspects 16 to 29.

Of course, the above-mentioned specific embodiments are only examples, not limitations, and those skilled in the art may combine some steps and devices from the above-mentioned separately described embodiments according to the concept of the present invention to achieve the same effects as the present invention. Such combined embodiments are also included in the present invention, which will not be described here.

It should be noted that the advantages, merit, effects, etc. mentioned in this disclosure are only examples and not limitations, and these advantages, merit, effects, etc. cannot be considered as necessary for each embodiment of the present invention. In addition, the specific details disclosed above are only for the purpose of illustration and for the convenience of understanding, but not for limitation. The invention is not limited to the above specific details to realize the invention.

The block diagrams of devices, apparatus, equipment and systems involved in this disclosure are only taken as exemplary examples and are not intended to require or imply that they must be connected, arranged and configured in the manner shown in the block diagram. As will be recognized by those skilled in the art, these devices, apparatus, devices and systems may be connected, arranged and configured in any manner. Terms such as "including", "comprising", "having" and so on are unlimited words, which mean "including but not limited to" and may be used interchangeably with them. The terms "or" and "and" used herein refer to the terms "and/or" and may be used interchangeably with them, unless otherwise indicated in the context. The term "such as" refers to the phrase "such as but not limited to" and may be used interchangeably with it.

The flowchart of steps in the present disclosure and the descriptions of the above method are only taken as exemplary examples and are not intended to require or imply that the steps of each embodiment must be performed in the given order. As will be recognized by those skilled in the art, the steps in the above embodiments may be performed in any order. Terms such as "after", "then", "next", etc. are not intended to limit the order of steps; these terms are only used to guide readers through the descriptions of these methods. Furthermore, any reference to an element in the singular form, such as those with the article "a", "an" or "the", is not to be interpreted as limiting the element to be singular.

In addition, the steps and apparatus in each embodiment in this paper are not limited to a certain embodiment. In fact, part of related steps and devices in each embodiment in this paper may provide reference to conceive new embodiments according to the concept of this invention, and these new embodiments are also included in the scope of this invention.

Each operation of the method described above may be performed by any appropriate means capable of performing corresponding functions. The means may include various hardware and/or software components and/or modules, including but not limited to circuits of hardware, Application Specific Integrated Circuits (ASIC) or processors.

Each exemplary logical block, module, and circuit described may be implemented or performed by using a general purpose processor, a digital signal processor (DSP), an ASIC, a Field Programmable Gate Array Signal (FPGA) or other programmable logic device (PLD), discrete gate or transistor logic, discrete hardware components, or any combination thereof designed to perform the functions described herein. A general-purpose processor may be a microprocessor, but alternatively, the processor may be any commercially available processor, controller, microcontroller or state machine. A processor may also be implemented as a combination of computing devices, such as a combination of DSP and microprocessor, a plurality of microprocessors, microprocessors cooperating with DSP cores, or any other such configuration.

The steps of a method or algorithm described in combination with the present disclosure may be directly embedded in hardware, a software module executed by a processor, or a combination of the two. Software modules may exist in any form of tangible storage medium. Examples of storage media that may be used include Random Access Memory (RAM), Read Only Memory (ROM), flash memory, EPROM memory, EEPROM memory, register, hard disk, removable disk, CD-ROM, etc. A storage medium may be coupled to a processor so that the processor may read information from and write information into the storage medium. In the alternative, the storage medium may be integral with the processor. A software module may be a single instruction or a plurality of instructions, and may be distributed over several different code segments, between different programs, and across multiple storage media.

The method disclosed herein includes actions for implementing the described method. Methods and/or actions may be interchanged with each other without departing from the scope of the claims. In other words, unless the order of actions is specified, the order and/or use of specific actions may be modified without departing from the scope of the claims.

The above functions may be implemented in hardware, software, firmware or any combination thereof. If implemented in software, the functions may be stored as instructions on a tangible computer-readable medium. A storage medium may be any available tangible medium that can be accessed by a computer. By way of example but not limitation, such computer-readable media may include RAM, ROM, EEPROM, CD-ROM or other optical disk storage, magnetic disk storage or other magnetic storage devices, or any other tangible media which can be used to carry or store desired program code in the form of instructions or data structures and which can be accessed by a computer. As used herein, the disk and discs include Compact Discs (CD), laser discs, optical discs, Digital Versatile Discs (DVD), floppy discs, and Blu-ray discs, where the disk usually reproduces data magnetically and the discs uses lasers to optically reproduce data.

Therefore, the computer program product can perform the operations given herein. For example, such a computer program product may be a computer-readable tangible medium having instructions tangibly stored (and/or encoded) thereon, and the instructions are executable by a processor to perform the operations described herein. A computer program product may include packaged materials.

Software or instructions may also be transmitted through transmission media. For example, the software may be transmitted from a website, a server or other remote source by using a transmission medium such as a coaxial cable, a fiber optic cable, a twisted pair, a Digital Subscriber Line (DSL) or the wireless technology such as infrared, radio or microwave.

In addition, modules and/or other appropriate means for performing the methods and techniques described herein can be obtained through downloading and/or other means by user terminals and/or base stations in an appropriate time. For example, such devices may be coupled to a server to facilitate the transfer of means for performing the methods described herein. Or, the various methods described herein may be provided via storage components (e.g., RAM, ROM, physical storage medium such as CD or floppy disk, etc.), so that the user terminal and/or the base station can obtain the various methods when coupling to the device or providing the storage components to the device. Furthermore, any other appropriate technique for providing the methods and techniques described herein to a device may be utilized.

Other examples and implementations are within the scope and spirit of this disclosure and the appended claims. For example, due to the nature of software, the functions described above may be implemented using software executed by a processor, hardware, firmware, hard wiring, or any combination of these. Features that implement functions may also be physically located at various locations, including being distributed so that parts of functions are implemented at different physical locations. Furthermore, as used herein, it is included in claims that "or" used in the enumeration of items starting with "at least one" indicates a separate enumeration, so the enumeration of "at least one of A, B, and C" means A or B or C, or AB or AC or BC, or ABC (i.e., A and B and C). Furthermore, the term "exemplary" does not mean that the described example is preferred or better than other examples.

Various changes, substitutions and modifications to the techniques described herein may be made without departing from the taught techniques defined by the appended claims. Furthermore, the scope of the claims of the present disclosure is not limited to the specific aspects of the composition, means, methods, or actions of processes, machines, manufacturing and events described above. Composition, means, methods, or actions of processes, machines, manufacturing and events, which currently exist or are to be developed later, and which perform substantially the same functions or achieve substantially the same results with the corresponding aspects described herein may be utilized. Therefore, the appended claims include the composition, means, methods or actions of such processes, machines, manufactures, events within their scope.

The above description of the disclosed aspects is provided to enable any person skilled in the art to make or use the invention. Various modifications to these aspects will be obvious to those skilled in the art, and the general principles defined herein may be applied to other aspects without departing from the scope of the present invention. Therefore, the invention is not intended to be limited to the aspects shown herein, but is to be accorded the widest scope consistent with the principles and novel features disclosed herein.

The above description has been given for the purposes of illustration and description. Furthermore, this description is not intended to limit embodiments of the invention to the forms disclosed herein. Although several example aspects and embodiments have been discussed above, those skilled in the art will recognize certain variations, modifications, changes, additions and subcombinations thereof.

The invention claimed is:

1. A driving system for detecting an on-chip voltage to adjust a gate voltage of a thin film transistor, comprising: an input circuit, configured to receive an input on-chip voltage and to output the on-chip voltage; and an adjusting circuit, configured to detect a present amplitude of the on-chip voltage output by the input circuit and to output a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage, wherein the adjusting circuit has a structure selected from a group including a first structure, a second structure and a third structure: the first structure comprises: a reference voltage generator, configured to output a plurality of reference voltages related to N selectable amplitudes of the on-chip voltage; a plurality of comparators, wherein each comparator is configured to compare the on-chip voltage output by the input circuit with a corresponding reference voltage and outputs comparison results; and a decision maker, configured to determine a mode related to the present amplitude of the on-chip voltage output by the input circuit detected from N modes related to the N selectable amplitudes of the on-chip voltage based on the comparison results of the plurality of comparators, and to output a bias voltage corresponding to the mode to the gate of the driven thin film transistor according to the determined mode, wherein N is a positive integer greater than 1, the second structure comprises: a V/I and I/V conversion circuit, configured to output a corresponding bias voltage based on the on-chip voltage output by the input circuit according to an input-output relationship between the on-chip voltage and the bias voltage, wherein the V/I and I/V conversion circuit comprise: a V/I conversion circuit, configured to convert the input on-chip voltage into a current signal; and a I/V conversion circuit, configured to convert the current signal into the corresponding bias voltage, and the third structure comprises: a plurality of resistors, configured to divide the input on-chin voltage to output a divided voltage.

2. The system according to claim 1 wherein the amplitude of each of the plurality of reference voltages is an intermediate voltage between two adjacent selectable amplitudes of the N selectable amplitudes;
   each of the plurality of comparators outputs a first value when the on-chip voltage is greater than the corresponding reference voltage, and outputs a second value when the on-chip voltage is less than or equal to the corresponding reference voltage, wherein each of the N modes corresponds to one of a plurality of possible codes consisting of the first value and/or the second value;
   an output result of the plurality of comparators is a result code consisting of first value and/or second value output by the plurality of comparators; and
   the decision maker is configured to determine the mode corresponding to the result code from the N modes according to the result code.

3. The system according to claim 2, wherein the reference voltage generator is a bandgap reference power source, the first value is a binary 1, the second value is a binary 0, the each comparator is an analog-to-digital converter, and the decision maker is a digital-to-analog converter.

4. The system according to claim 1, wherein the bias voltage is set to 0V if the amplitude of the on-chip voltage is 1.8V, the bias voltage is set to ¼ of the on-chip voltage if the amplitude of the on-chip voltage is 2.5V, and the bias voltage is set to ⅓ of the on-chip voltage if the amplitude of the on-chip voltage is 3.3V.

5. The system of claim 1, wherein the input circuit comprises an averaging circuit configured to average the on-chip voltage and output the averaged on-chip voltage, wherein the averaging circuit comprises at least one capacitor and at least one resistor.

6. The system of claim 1, wherein the driving system further comprises: a threshold decoder configured, based on the determined mode, to set gates of a part of thin film transistors in a receiver to threshold voltages corresponding to the determined mode, wherein gate voltages of other thin film transistors in the receiver are the on-chip voltages.

7. The system according to claim 6, wherein the threshold voltage for the on-chip voltage with an amplitude of 1.8V is set to 0.9V, the threshold voltage for the on-chip voltage with an amplitude of 2.5V is set to 1.25V, and the threshold voltage for the on-chip voltage with an amplitude of 3.3V is set to 1.65V.

8. The system according to claim 1, wherein the driving system comprises a switch group configured to connect with the on-chip voltage and disconnect coupling with the thin film transistor in a period so as to turn off the thin film transistor to output a preset bias voltage or a preset threshold voltage based on a preset amplitude of the on-chip voltage output by the input circuit, and the switch group is configured to connect the coupling with the thin film transistor in a normal operation period.

9. The system according to claim 8, wherein the period is controlled by a counter, and during a counting period of the counter, a series of pulses with a low level and a high level alternating with each other are generated so that the on-chip voltage received by the input circuit is a periodic wave; and
when the counting of the counter ends, the pulses change into a low level, indicating a beginning of the normal operation period.

10. A driving method for detecting an on-chip voltage to adjust a gate voltage of a thin film transistor, comprising: an input step, receiving an input on-chip voltage by an input circuit and outputting the on-chip voltage; and an adjusting step, detecting a present amplitude of the on-chip voltage output by the input circuit by an adjusting circuit, and outputting a bias voltage corresponding to the present amplitude of the on-chip voltage to a gate of the driven thin film transistor, wherein a source of the thin film transistor is directly or indirectly coupled to the on-chip voltage, and the bias voltage is lower than the on-chip voltage, wherein the adjusting step comprises a set of steps selected from a group of a first set of steps, a second set of steps, and a third set of steps, wherein the first set of steps comprises outputting, by a reference voltage generator, a plurality of reference voltages related to N selectable amplitudes of the on-chip voltage; comparing, by a plurality of comparators, the on-chip voltage output by the input circuit with the corresponding reference voltage, and outputting comparison results; and determining, by a decision maker, a mode related to the present amplitude of the on-chip voltage output by the input circuit detected from N modes related to the N selectable amplitudes of the on-chip voltage based on the comparison results of the plurality of comparators, and according to the determined mode, outputting a bias voltage corresponding to the mode to the gate of the driven thin film transistor, wherein N is a positive integer greater than 1, wherein the second set of steps comprises: outputting the corresponding bias voltage by a V/I and I/V conversion circuit based on the on-chip voltage output by the input circuit according to an input-output relationship between the on-chip voltage and the bias voltage, wherein the step of outputting the corresponding bias voltage by the V/I and I/V conversion circuit based on the on-chip voltage output by the input circuit according to the input-output relationship between the on-chip voltage and the bias voltage comprises: converting the input on-chip voltage into a current signal by a V/I conversion circuit; and converting the current signal into the corresponding bias voltage by an I/V conversion circuit, wherein the third set of steps comprises: dividing, by a plurality of resistors, the input on-chip voltage to output a divided voltage.

11. The method according to claim 10, wherein the amplitude of each of the plurality of reference voltages is an intermediate voltage between two adjacent selectable amplitudes of the N selectable amplitudes, the comparing, by a plurality of comparators, the on-chip voltage output by the input circuit with a corresponding reference voltage and outputting comparison results comprises:
outputting, by each of the plurality of comparators, a first value when the on-chip voltage is greater than a corresponding reference voltage, and outputting a second value when the on-chip voltage is less than or equal to a corresponding reference voltage, wherein each of the N modes corresponds to one of a plurality of possible codes consisting of the first value and/or the second value;
wherein an output result of the plurality of comparators is a result code consisting of first value and/or second value output by the plurality of comparators,
wherein the step of determining the mode by the decision maker based on the comparison results of the plurality of comparators comprises:
determining, by the decision maker, the mode corresponding to the result code from the N modes according to the result code.

12. The method according to claim 10, wherein the method further comprises: setting, by a threshold decoder, the gates of a part of thin film transistors in a receiver to threshold voltages corresponding to the determined mode based on the determined mode, wherein gate voltages of other thin film transistors in the receiver are the on-chip voltages.

13. The method according to claim 10, wherein the method further comprises: connecting with the on-chip voltage and disconnecting the coupling with the thin film transistor by a switch group to turn off the thin film transistor in a period to output a preset bias voltage or a preset threshold voltage based on a preset amplitude of the on-chip voltage output by the input circuit, and the method further comprises: connecting the coupling with the thin film transistor in a normal operation period by the switch group.

14. The method according to claim 13, wherein the period is controlled by a counter, and during a counting period of the counter, a series of pulses with a low level and a high level alternating with each other are generated so that the on-chip voltage received by the input circuit is a periodic wave,
and when the counting of the counter ends, the pulses change into a low level, indicating a beginning of the normal operation period.

15. A computer system, comprising:
a processor; and
a memory coupled to the processor storing therein computer executable instructions for performing the driving method according to claim 10 when executed by the processor.

16. A non-transitory computer readable medium storing thereon a computer program, wherein the program implements the driving method according to claim 10 when executed by a processor.

* * * * *